US006535384B2

(12) United States Patent
Huang

(10) Patent No.: US 6,535,384 B2
(45) Date of Patent: Mar. 18, 2003

(54) HARD DISKDRIVE MOBILE RACK COOLING ARRANGEMENT

(76) Inventor: Cheng Yu Huang, 4F, 4, Lane 6, Alley 48, Cheng Chang St., Hsinchung, Taipei Hsien (TW)

( * ) Notice: Subject to any disclaimer, the term of this patent is extended or adjusted under 35 U.S.C. 154(b) by 0 days.

(21) Appl. No.: 09/767,876

(22) Filed: Jan. 24, 2001

(65) Prior Publication Data

US 2001/0008480 A1 Jul. 19, 2001

(51) Int. Cl.[7] .............................................. H05K 7/20
(52) U.S. Cl. ....................... 361/695; 361/685; 361/690; 361/694; 174/16.1; 174/16.3; 165/80.3; 454/184
(58) Field of Search ................................ 361/676–678, 361/690–695, 704; 174/16.1; 165/80.3, 104.33, 104.34, 185; 454/184; 312/223.2

(56) References Cited

U.S. PATENT DOCUMENTS

| 5,171,183 A | * | 12/1992 | Pollard et al. ............... 454/184 |
| 5,694,290 A | * | 12/1997 | Chang ......................... 361/685 |
| 6,185,097 B1 | * | 2/2001 | Behl ........................... 361/695 |
| 6,236,564 B1 | * | 5/2001 | Fan ............................. 361/695 |
| 6,252,770 B1 | * | 6/2001 | Yu et al. ..................... 361/695 |
| 6,272,011 B1 | * | 8/2001 | Chen ........................... 361/685 |
| 6,362,958 B1 | * | 3/2002 | Yu et al. ..................... 361/687 |

* cited by examiner

Primary Examiner—Boris Chervinsky
(74) Attorney, Agent, or Firm—Troxell Law Office PLLC

(57) ABSTRACT

A hard diskdrive mobile rack includes a rack adapted to hold a hard diskdrive, the rack having a plurality of air vents through a bottom panel thereof and a plurality of hook holes symmetrically provided at two sides of each air vent, and a plurality of induced-draft fans respectively installed in the air vents.

3 Claims, 3 Drawing Sheets

HARD DISKDRIVE MOBILE RACK COOLING ARRANGEMENT

BACKGROUND OF THE INVENTION

The present invention relates to a mobile rack for hard diskdrive and, more specifically, to a hard diskdrive mobile rack cooling arrangement in which induced-draft fans are installed in respective air vents at the bottom side of the hard diskdrive mobile rack for dissipation of heat from the hard diskdrive upon its operation.

During the operation of a computer, heat must be quickly carried away, keeping the temperature inside the computer within the set working temperature range. Various effective CPU and AC adapter heat sink and fan cooling designs have been disclosed. However, few effective hard diskdrive cooling designs are commercially available. For cooling t he hard diskdrive of a computer, it is generally to install a fan in the back or front panel of the casing of the computer in front or at the back side of the hard diskdrive. This arrangement is less effect, and does little help to the cooling of a mobile hard diskdrive.

SUMMARY OF THE INVENTION

The present invention has been accomplished under the circumstances in view. It is the main object of the present invention to provide a hard diskdrive mobile rack cooling arrangement, which quickly carries heat from the mobile hard diskdrive upon its operation. According to the present invention, air vents are provided at the bottom side of the hard diskdrive mobile rack, and induced-draft fans are respectively installed in the air vents and controlled to draw hot air out of the rack upon operation of the hard diskdrive in the rack.

DETAILED DESCRIPTION OF THE PREFERRED EMBODIMENT

Figure 1:
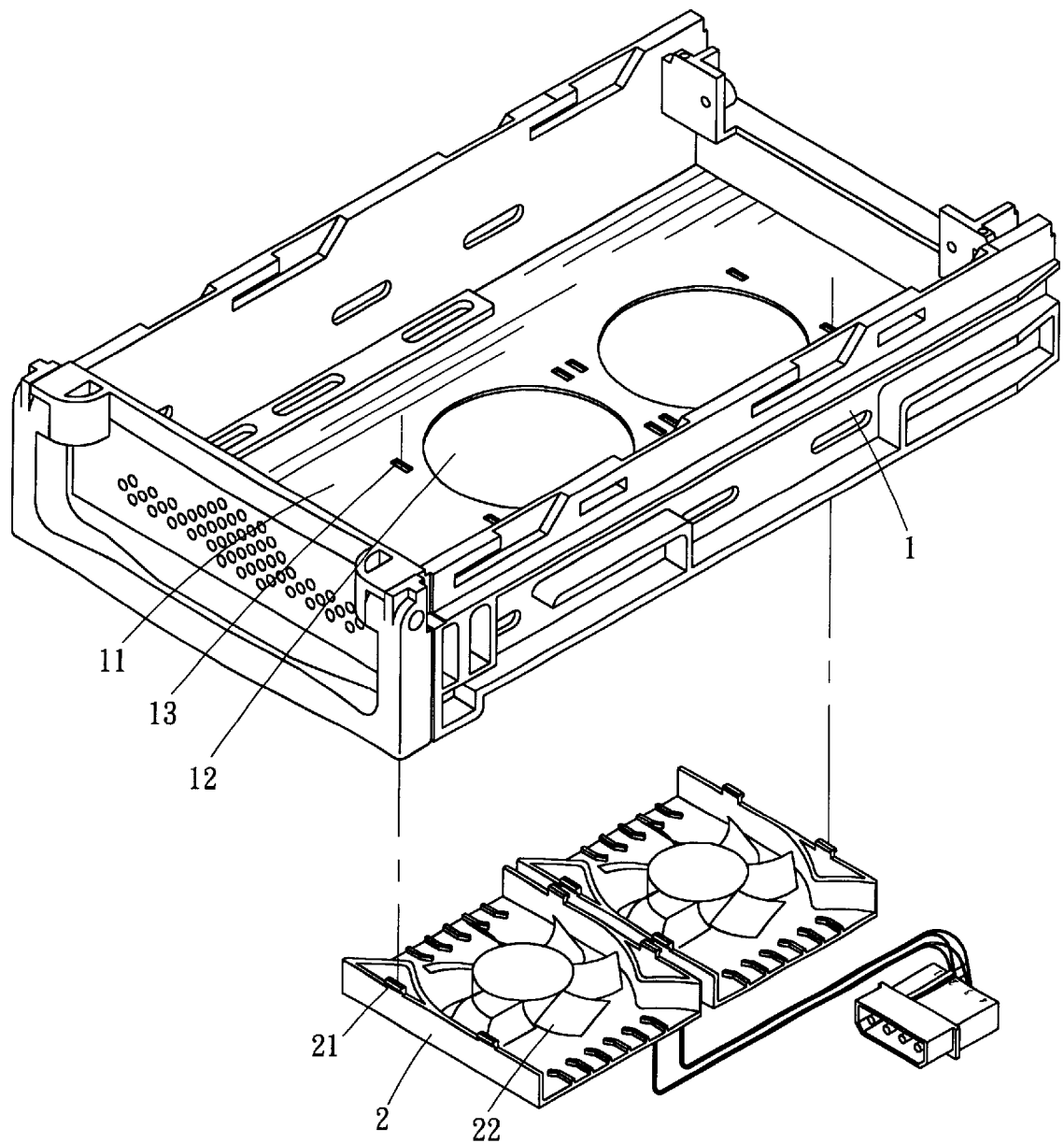
FIG. 1 is an exploded view of the present in invention.
Figure 2:
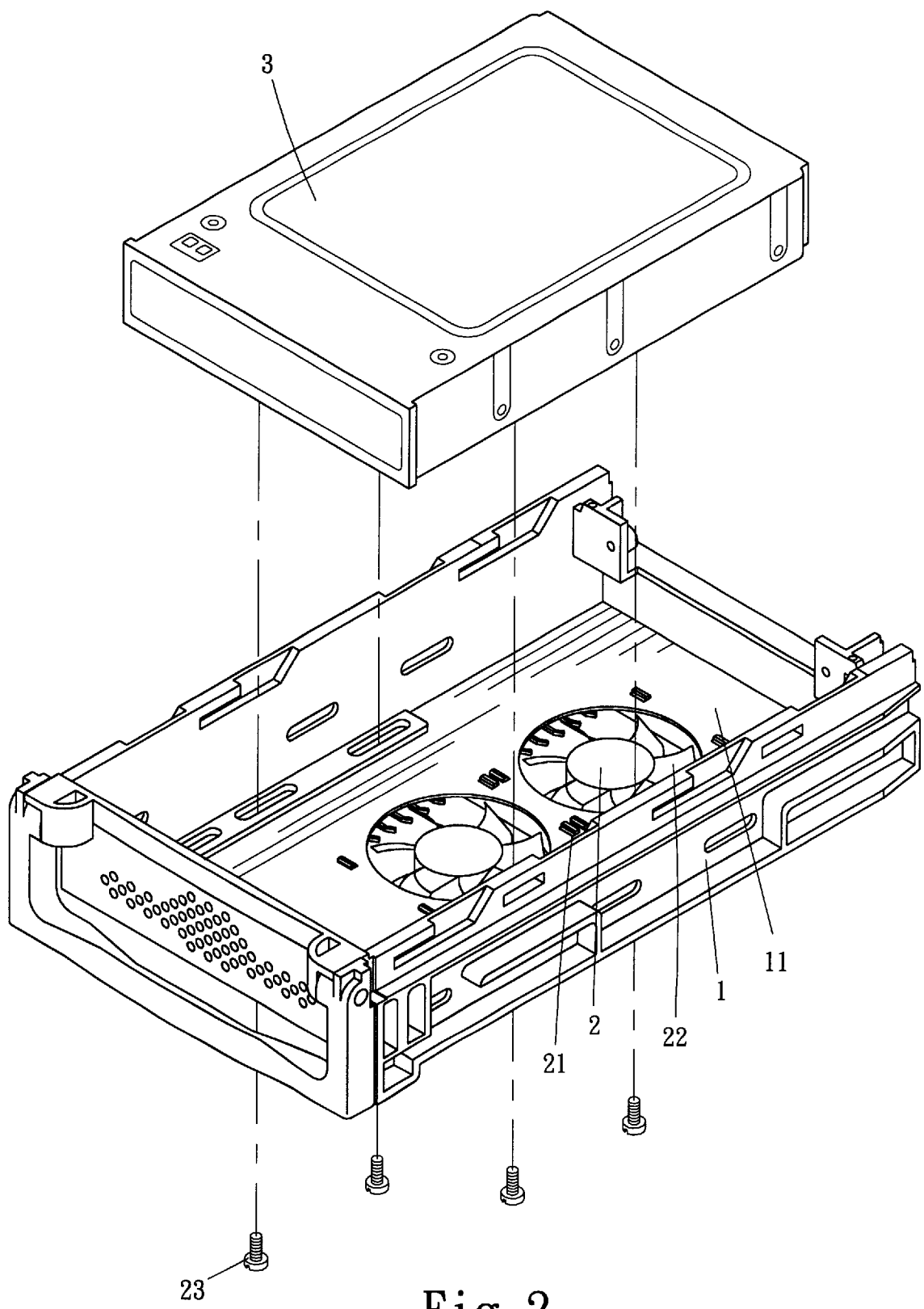
FIG. 2 illustrates the relationship between a hard diskdrive mobile rack and a hard diskdrive according to the present invention.

Referring to FIG. 1, a hard diskdrive mobile rack in accordance with the present invention comprises a rack 1, at least one, for example, two induced-draft fans 2, and a hard diskdrive 3. The rack 1 comprises a bottom panel 11, two air vents 12 through the bottom panel 11, and a plurality of hook holes 13 symmetrically provided at two sides of each air vent 12. The induced-draft fans 2 each comprise a plurality of hooks 21 respectively hooked in the hook holes 13 of the rack 1, and a fan blade and motor assembly 22 suspended in one air vent 12. The hard diskdrive 3 is mounted in the rack 1 and covered over the air vents 12, and fixedly fastened to the bottom panel 11 by screws 23.

The width of the induced-draft fans 2 is shorter than the rack 1. Therefore, there is sufficient space provided at two sides of the induced-draft fans 2 for exhaust of heat source efficiently.

Figure 3:
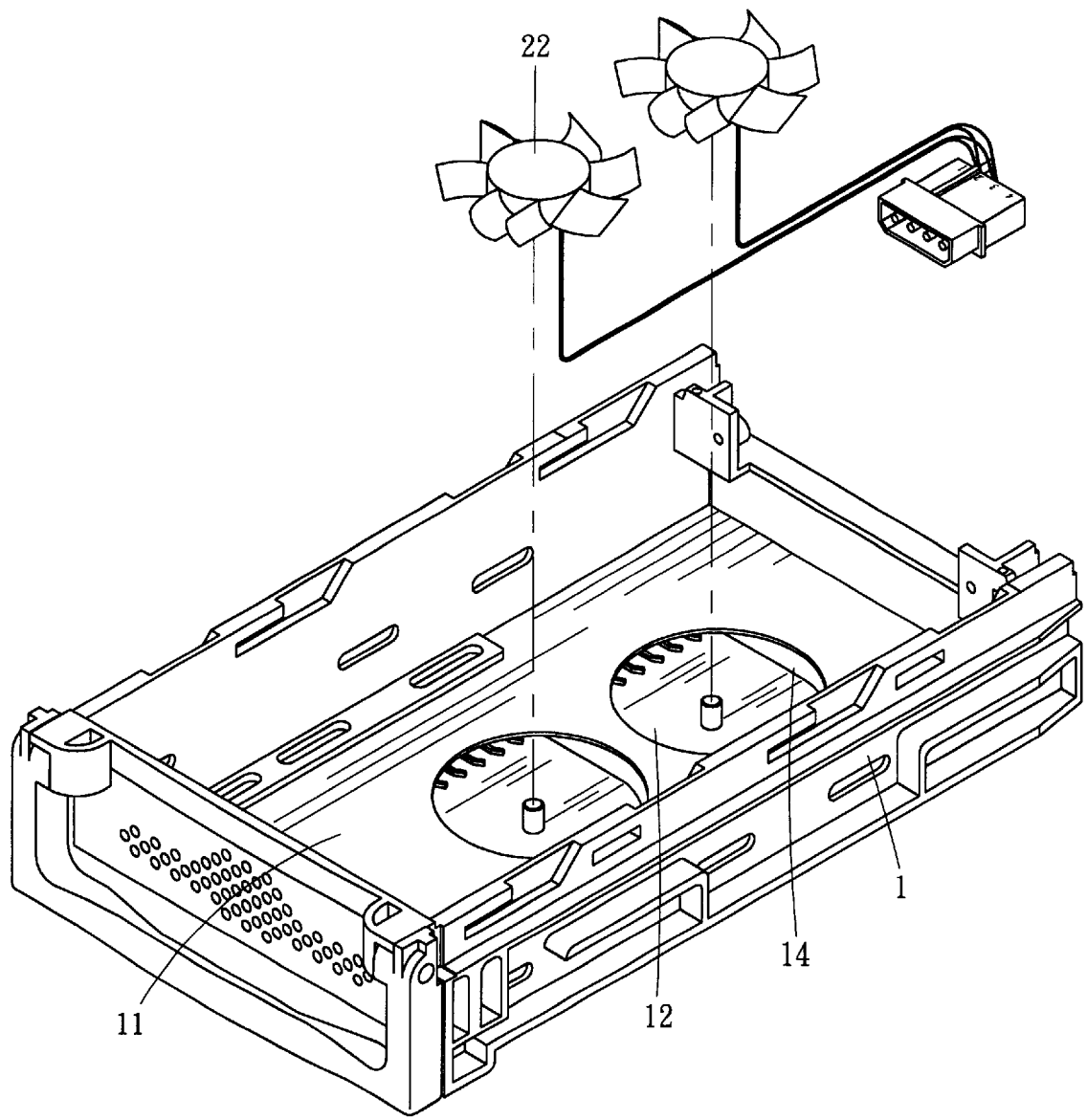
FIG. 3 illustrates an alternate form of the present invention.

FIG. 3 shows an alternate form of the present invention. According to this alternate form, each induced-draft fan comprises a frame 14 formed integral with the bottom panel 11 of the rack 1 and bridged over the corresponding air vent 12, and a fan blade and motor assembly 22 detachably mounted on the frame 14.

It is to be understood that the drawings are designed for purposes of illustration only, and are not intended for use as a definition of the limits and scope of the invention disclosed.

What the invention claimed is:

1. A mobile rack assembly for a hard disk drive and comprising:
    a) a mobile rack configured to hold a hard disk drive, the mobile rack including a bottom panel with at least one air vent opening therethrough and a plurality of hook holes located adjacent to the at least one air vent; and
    b) at least one induced-draft fan assembly, each induced-draft fan assembly comprising a rack having open, opposite sides, a fan blade and motor assembly mounted on the rack, and a plurality of hooks on the rack engaged with the plurality of hook holes so as to mount the at least one induced-draft fan assembly to the mobile rack such that the fan blade and motor assembly is aligned with the at least one air vent opening, and such that the open, opposite sides of the rack form air exhaust vents bounded by the rack and the bottom panel of the mobile carrier.

2. The mobile rack assembly of claim 1 further comprising two air vents in the bottom panel and two induced-draft fan assemblies.

3. The mobile rack assembly of claim 1 wherein the plurality of hook holes are symmetrically arranged.

* * * * *